(12) United States Patent
Nagaraja et al.

(10) Patent No.: US 7,692,134 B2
(45) Date of Patent: Apr. 6, 2010

(54) VARIABLE TRANSFER GATE OXIDE THICKNESS FOR IMAGE SENSOR

(75) Inventors: Satyadev Nagaraja, San Jose, CA (US); Hidetoshi Nozaki, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/054,296

(22) Filed: Mar. 24, 2008

(65) Prior Publication Data

US 2009/0236498 A1    Sep. 24, 2009

(51) Int. Cl.
*H01L 31/00* (2006.01)
*H01L 31/062* (2006.01)
(52) U.S. Cl. .................................. 250/214.1; 257/292
(58) Field of Classification Search .............. 250/214.1, 250/214 R, 208.1; 257/290–292, 256, 257, 257/258, 431–466, 233, 229, 222, 223; 438/200, 438/45
See application file for complete search history.

(56) References Cited

U.S. PATENT DOCUMENTS

| | | | | |
|---|---|---|---|---|
| 3,877,058 | A * | 4/1975 | Cricchi | 257/292 |
| 6,392,261 | B1 * | 5/2002 | Hatano | 257/229 |
| 6,642,543 | B1 * | 11/2003 | El Gamal et al. | 257/72 |
| 6,946,694 | B2 * | 9/2005 | Okamoto et al. | 257/222 |
| 7,170,117 | B2 * | 1/2007 | Mouli | 257/226 |
| 2005/0266625 | A1 | 12/2005 | Lim | |
| 2006/0226456 | A1 * | 10/2006 | Adkisson et al. | 257/291 |
| 2007/0145239 | A1 * | 6/2007 | Mheen et al. | 250/208.1 |
| 2008/0079043 | A1 * | 4/2008 | Kim et al. | 257/292 |

FOREIGN PATENT DOCUMENTS

KR        10-0275122       *  9/2000

\* cited by examiner

*Primary Examiner*—Que T Le
*Assistant Examiner*—Jennifer Bennett
(74) *Attorney, Agent, or Firm*—Blakely Sokoloff Taylor & Zafman, LLP

(57) ABSTRACT

A light sensor cell includes a photosensitive element, a floating diffusion region, and a gate oxide disposed between the photosensitive element and the floating diffusion region. The gate oxide has a non-uniform thickness, with a greater thickness near the photosensitive element and a lesser thickness near the floating diffusion region. A transfer gate is disposed on the gate oxide. The transfer gate has a non-uniform threshold voltage, with a greater threshold voltage near the photosensitive element and a lesser threshold voltage near the floating diffusion region.

16 Claims, 7 Drawing Sheets

VARIABLE TRANSFER GATE OXIDE THICKNESS FOR IMAGE SENSOR

BACKGROUND

1. Field

Embodiments of the present invention relate to image sensors and, in particular, to gate oxides for transfer gates in image sensors.

2. Discussion of Related Art

An image sensor commonly includes several light sensor cells. A typical individual light sensor cell may have a micro-lens, a filter, a photosensitive element, a floating diffusion region, and one or more transistors for reading out a signal from the photosensitive element. One of the transistors is a transfer transistor. The transfer transistor has a transfer gate disposed between the photosensitive element and the floating diffusion. The transfer gate is disposed on a gate oxide. The photosensitive element, floating diffusion region, and gate oxide are disposed on a substrate. The image sensor may be fabricated using complementary metal oxide semiconductor (CMOS) technology or charge coupled device (CCD) technology.

A light sensor cell may operate as follows. Light is incident on the micro-lens, which focuses the light to the photosensitive element through the filter. The photosensitive element detects the light and converts the light into an electrical signal proportional to the intensity of the light detected. The transfer gate transfers the electrical signal from the photosensitive element to the floating diffusion region.

Conventional image sensors work well, but have some limitations. One limitation is that the photosensitive element may not be completely emptied between successive readings. Some of the information from the previous light signal remains in the photosensitive element, having not been transferred to the floating diffusion. The leftover information may be termed image lag, residual image, ghosting, frame to frame retention, etc.

One method of dealing with image lag is to use a dopant underneath the transfer gate. A lateral electric field is created by means of a graded p-type doping of the channel between the photosensitive element and the floating diffusion region, which accelerates the electrons in the channel during readout. However, this can cause two potential problems. One potential problem is a reduction in full well capacity due to the diffusion of the p-type dopant into the photosensitive element. If the p-type dopant is diffused into the photosensitive element, the n-type dopants in the photosensitive element may be compensated and the amount of charge the individual photosensitive element can hold before saturating may be reduced.

A second potential problem is the formation of a potential energy barrier at the region where the photosensitive element connects to the channel underneath the transfer gate. Consequently, not all the photo-generated electrons are able to leave the photosensitive element during readout as some are not energetic enough to cross this potential energy barrier.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

According to embodiments of the present invention, an image sensor includes an array of light sensor cells disposed in a substrate. An individual light sensor cell includes a photosensitive element and a floating diffusion region. A gate oxide having a variable thickness is disposed between the photosensitive element and the floating diffusion region. A first thickness of the gate oxide may be graded to a second thickness of the gate oxide. The first thickness, which may be greater than the second thickness, may be in proximity to the photosensitive element. The second thickness may be in proximity to the floating diffusion region.

Having the greater gate oxide thickness near the photosensitive element and the lesser gate oxide thickness near the floating diffusion region allows the electrical charge accumulated in the photosensitive element during the exposure period to be read out more quickly than in conventional image sensor cells. If the readout is quicker, the likelihood of information from the previous light signal remaining in the photosensitive element is less than in conventional light sensor cells. As a result, image lag may be reduced. Other features and advantages of the present invention will be apparent from the accompanying drawings and from the detailed description that follows.

Figure 1:
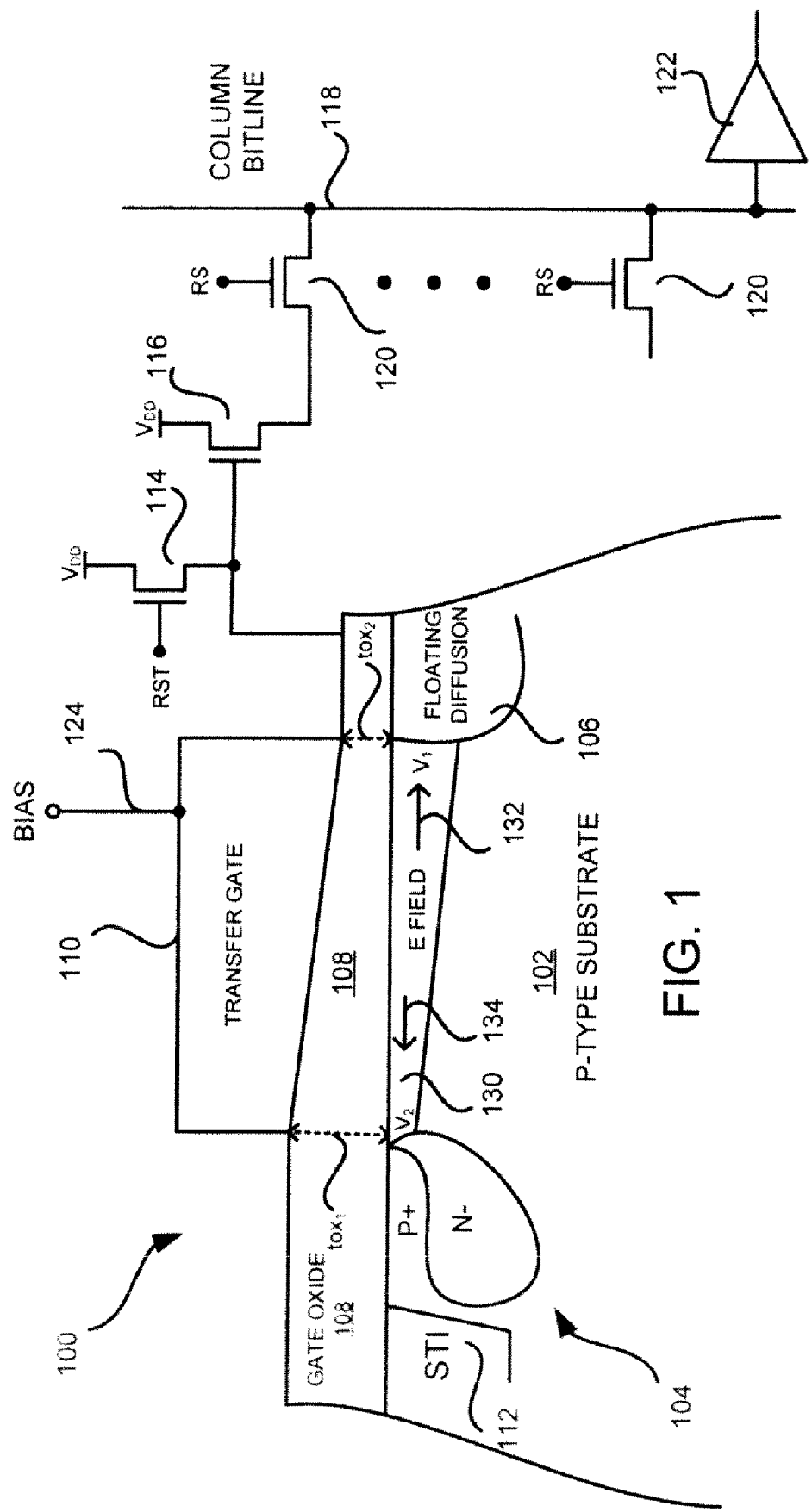
FIG. 1 is a side view of a portion of a light sensor cell that has a variable gate oxide thickness according to an embodiment of the present invention.

FIG. 1 is a side view of a portion of a light sensor cell 100 according to an embodiment of the present invention. Generally, an image sensor includes several light sensor cells 100 arranged in an array of two dimensional rows and columns in a substrate 102. In the illustrated embodiment, the sensor cell 100 includes a photosensitive element 104 and a floating diffusion region 106 disposed on the substrate 102. A gate oxide 108 is disposed on the substrate 102.

In the embodiment illustrated in FIG. 1, the gate oxide 108 is graded from a first thickness $t_{ox1}$ near the photosensitive element 104 to a second thickness $t_{ox2}$ near the floating diffusion region 106. The graded gate oxide 108 thickness illustrated in FIG. 1 allows the effective threshold voltage of the transfer gate 110 to vary from a relatively high value at the photosensitive element 104 end of the sensor cell 100 to a relatively low value at the floating diffusion region 106 end. For some embodiments, the effective threshold voltage of the gate oxide thickness $t_{ox1}$ near the photosensitive element 104 is greater that the effective threshold voltage of the gate thickness $t_{ox2}$ near the floating diffusion region 106.

In the illustrated embodiment, shallow trench isolation 112 also is disposed in or on the substrate 102.

The light sensor cell 100 may include several transistors. In the illustrated embodiment, the light sensor cell 100 is a four transistor (4T) cell. A transfer transistor having a transfer gate 110 is disposed on the gate oxide 108. The transfer gate 110 is between the photosensitive element 104 and the capacitive floating diffusion region 106 and is used to transfer the signal output by the photosensitive element 104 to the floating diffusion region 106. The illustrated sensor cell 100 also includes a reset gate 114 between the floating diffusion region 106 and a power supply $V_{DD}$, a source-follower transistor 116 to buffer the floating diffusion region 106 from column bitline 118, and a row-select gate 120 to connect the light sensor cell 100 to the column bitline 118. All sensor cells 100 on the column bitline 118 may connect to a common sense amplifier 122. A bias voltage 124 is coupled to the transfer gate 110. Although shown as 4T architecture, the light sensor cell 100 may be 3T architecture, 5T architecture, 6T architecture, 7T architecture, etc.

An embodiment of the light sensor cell 100 operates as follows. During an integration period (also referred to as an exposure or accumulation period), light is incident on the photosensitive element 104. The photosensitive element 104 generates an electrical signal in response to the incident light. The electric signal is held in the photosensitive element 104. At this stage, the transfer transistor may be turned off. In one embodiment, the bias voltage 124 on the transfer gate 110 may be a negative voltage.

When the bias voltage on the transfer gate 110 is negative, the channel 130 effectively becomes resistant to electron flow. A driving force 134 is created that tends to hinder electron motion between the photosensitive element 104 to the floating diffusion region 106. The corresponding electric field to the driving force 134 is in the opposite direction, as electrons drift against the electric field. Thus arrow 132 can also represent the electric field corresponding to the driving force 134.

After the integration period, the transfer gate 110 is turned on to read out the photosensitive element 104. In one embodiment, a positive bias voltage 124 may be applied to the transfer gate 110. When the transfer gate 110 is turned on, the channel 130 becomes conductive. According to an embodiment, a potential $V_1$ in proximity to the floating diffusion region 106 is generated and a potential $V_2$ in proximity to the photosensitive element 104 are generated in the channel 130. The two potentials $V_1$ and $V_2$ are different due to the different effective threshold voltages for the transfer gate 110. The difference in potential generates a driving force 132 in the channel 130. The driving force 132 accelerates electron flow in the channel 130 from the photosensitive element 104 toward the floating diffusion region 106. This driving force 132 also prevents electrons from flowing back to the photosensitive element 104 at the end of the readout cycle, thereby achieving a more complete charge transfer. The corresponding electric field to the driving force 132 is in the opposite direction, as electrons drift against the electric field. Thus arrow 134 can also represent the electric field corresponding to the driving force 132.

The different effective threshold voltages for the transfer gate 110 may cause the channel 130 to become less resistant as soon as the effective threshold voltage near the floating diffusion region 106 is reached. The channel near the floating diffusion region 106 becomes conductive. The channel 130 may continue to gradually become conductive as the effective threshold voltage near the photosensitive element 104 is approached. The channel 130 may become fully conductive when the effective threshold voltage near the photosensitive element 104 is reached. Electrons from the photosensitive element 104 may flow in the channel 130 toward the floating diffusion region 106 more completely than in conventional image sensors. If the readout from the photosensitive element 104 is more complete compared to conventional light sensor cells according to embodiments of the present invention, the likelihood of information from the previous light signal remaining in the photosensitive element 104 is less than in conventional light sensor cells. As a result, image lag may be reduced.

After the electrical signal in the photosensitive element 104 has been transferred to the floating diffusion region 106, the transfer gate 110 is turned off for the start of a subsequent integration period. The accelerated electron flow may reduce image lag by allowing the photosensitive element 104 to be substantially completely emptied between successive readings.

The signal on the floating diffusion region 106 may then be used to modulate the source follower transistor 116. After readout, the reset transistor 120 may reset the floating diffusion region 106 to a reference voltage, such as $V_{DD}$.

In the embodiment illustrated in FIG. 1, the gate oxide 108 is graded continuously from a first thickness $t_{ox1}$ near the photosensitive element 104 to a second thickness $t_{ox2}$ near the floating diffusion region 106. Although shown as a straight line, the grade of the gate oxide 108 may take many forms.

Figure 2:
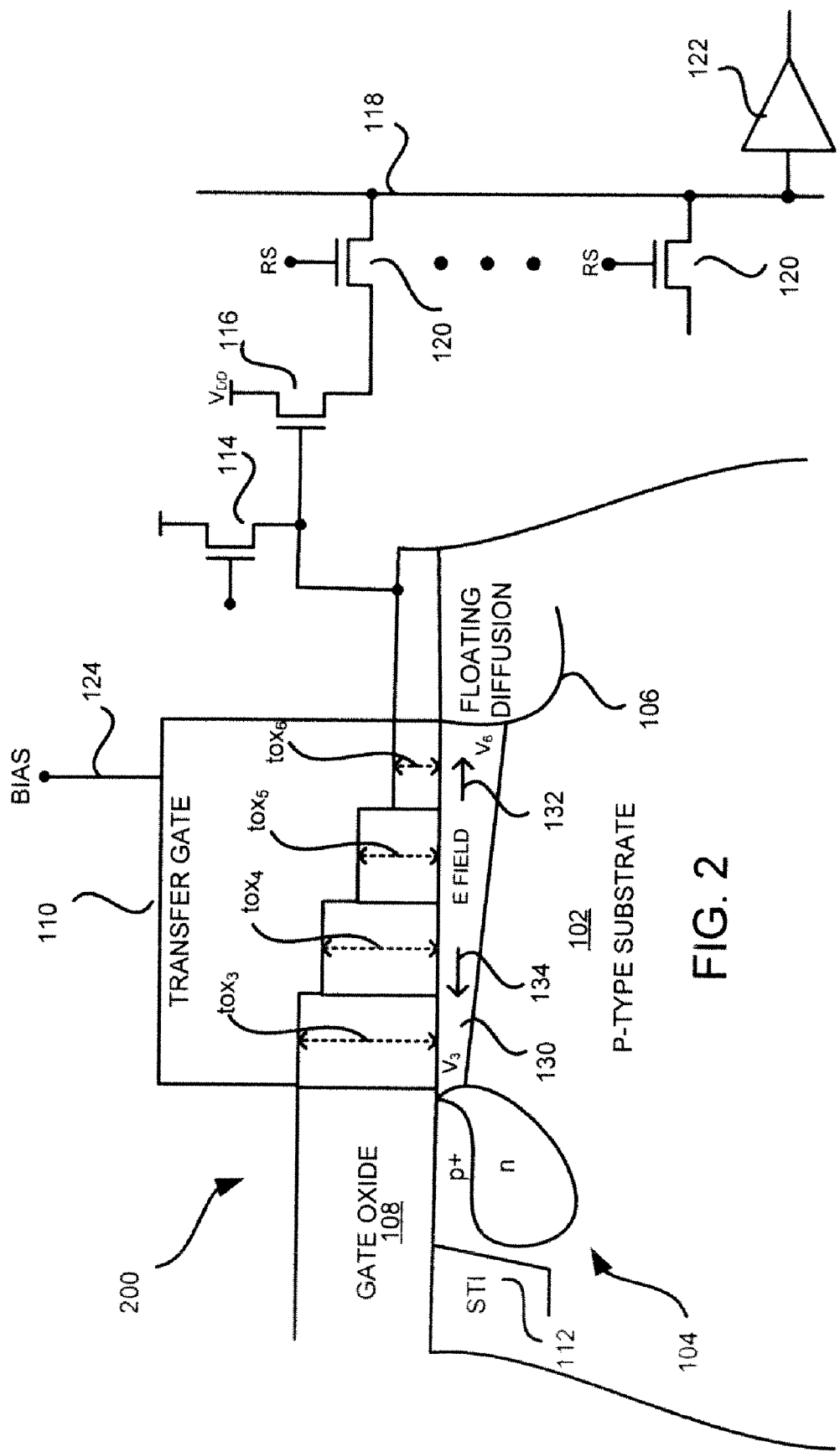
FIG. 2 is a side view of a portion of a light sensor cell that has a variable gate oxide thickness according to an alternative embodiment of the present invention.

FIG. 2 is a side view of a portion of a light sensor cell 200 according to an alternative embodiment of the present invention in which the gate oxide 108 is graded in steps. As is the case with the light sensor cell 100, the light sensor cell 200 includes the photosensitive element 104, the floating diffusion region 106, and the gate oxide 108 is disposed on the substrate 102. The transfer gate 110 is disposed on the gate oxide 108 between the photosensitive element 104 and the floating diffusion region 106. Shallow trench isolation 112 is disposed in the substrate 102. The light sensor cell 200 also has a 4T architecture with the reset gate 114 disposed between the floating diffusion region 106 and the power supply $V_{DD}$, the source-follower transistor 116 to buffer the floating diffusion region 106 from column bitline 118, and the row-select gate 120 to connect the light sensor cell 200 to the column bitline 118. The light sensor cell 200 also connects to a common sense amplifier 122 and has the bias voltage 124 coupled to the transfer gate 110.

In the embodiment illustrated in FIG. 2, however, the thickness of the gate oxide 108 decreases discontinuously from the photosensitive element 104 to the floating diffusion region 106. For example, the first oxide thickness $t_{ox3}$ near the photosensitive element 104 is stepped in an increment to a second thickness $t_{ox4}$. The second thickness $t_{ox4}$ is stepped to a third thickness $t_{ox5}$. The third thickness $t_{ox5}$ is stepped to a fourth thickness $t_{ox6}$.

Although four thicknesses are shown in FIG. 2, it is not necessary to have four thicknesses. For example, there may be a first thickness near the photosensitive element 102 stepped to a second thickness near the floating diffusion region 106. In the embodiment shown in FIG. 2, the two extra thicknesses are optional. Alternatively, there may be a greater number of steps. It will be appreciated by those skilled in the relevant art having benefit of this disclosure how to implement embodiments of the present invention with any number of steps to achieve the variable thickness in the gate oxide 108.

For some embodiments, the incrementally stepped gate oxide 108 thickness illustrated in FIG. 2 allows the effective threshold voltage of the transfer transistor to vary discontinuously from a relatively high value at the photosensitive element 104 end of the sensor cell 100 to a relatively low value at the floating diffusion region 106 end. In one embodiment, the effective threshold voltage of the gate oxide thickness $t_{ox3}$ is greater than the effective threshold voltage of the gate thickness $t_{ox4}$, the effective threshold voltage of the gate thickness $t_{ox4}$ is greater than the effective threshold voltage of the gate thickness $t_{ox5}$, and the effective threshold voltage of the gate thickness $t_{ox5}$ is greater than the effective threshold voltage of the gate thickness $t_{ox6}$.

An embodiment of the light sensor cell 200 operates similarly to the light sensor cell 100. During integration, the transfer transistor may be turned off and light is incident on the photosensitive element 104. The photosensitive element 104 converts the light to an electrical signal, which is held in the photosensitive element 104 until readout because the channel 130 is resistant to electron flow.

To read out the photosensitive element 104, the transfer gate 110 is turned on and the channel 130 becomes conductive. According to an embodiment, a potential $V_6$ in proximity to the floating diffusion region 106 and the potential $V_3$ in proximity to the photosensitive element 104 are generated in the channel 130. The difference in potential generates an electric field 132 in the channel 130. The electric field 132 allows electrons to flow in the channel 130 from the photosensitive element 104 toward the floating diffusion region 106.

The different effective threshold voltages for the transfer gate 110 may cause the channel 130 to become less resistant as soon as the effective threshold voltage of the transfer gate 110 disposed on the gate oxide 108 having the thickness $t_{ox6}$ is reached. The channel 130 may become more conductive as the effective threshold voltage of the transfer gate 110 disposed on the gate oxide 108 having the thickness $t_{ox5}$ is reached. The channel 130 may become more conductive as the effective threshold voltage of the transfer gate 110 disposed on the gate oxide 108 having the thickness $t_{ox4}$ is reached. The channel 130 may become fully conductive when the effective threshold voltage of the transfer gate 110 disposed on the gate oxide 108 having the thickness $t_{ox3}$ is reached. Electrons from the photosensitive element 104 may flow in the channel 130 toward the floating diffusion region 106 more easily or completely than in conventional image sensors. If the readout from the photosensitive element 104 is more complete compared to conventional light sensor cells according to embodiments of the present invention, the likelihood of information from the previous light signal remaining in the photosensitive element 104 is less than in conventional light sensor cells. As a result, image lag may be reduced.

For some embodiments, the substrate 102 may be any suitable substrate. One suitable substrate is a semiconductor substrate. The material may be silicon. The illustrated substrate is doped p-type silicon.

For some embodiments, the photosensitive element 104 may be any suitable device that converts light into an electric signal. The photosensitive element 104 may be a photodiode, photogate, or other solid state device. Other suitable photosensitive elements may be utilized as well. As shown, the photosensitive element 104 is a PN junction photodiode.

The gate oxide 108 may be any suitable insulating material. For some embodiments, the gate oxide 108 may be silicon dioxide.

The transfer gate 110 may be polysilicon or any suitable gate material.

Shallow trench isolation 112 may be any suitable insulating material capable of preventing leakage of electrical signals between components on the substrate 102.

Figure 3:
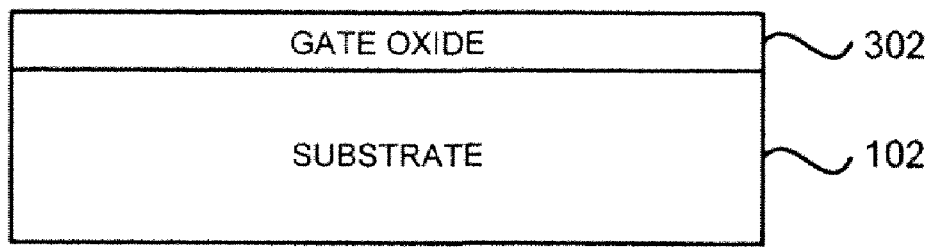
FIGS. 3 through 12 show side views of the portion of the light sensor cell in FIG. 2 undergoing a fabrication process according to an embodiment of the present invention.

Fabrication of a gate oxide according to at least one embodiment will now be described with reference to FIG. 3 through FIG. 13. The embodiment shown in FIG. 3 shows a first step in the fabrication process according to an embodiment of the present invention. For example, FIG. 3 is a side view showing a gate oxide material 302 disposed on the substrate 102 in the transfer gate 110 area. The gate oxide material 302 may be disposed on the substrate 102 using thermal oxidation, chemical vapor deposition (CVD), or other suitable technique.

Figure 4:
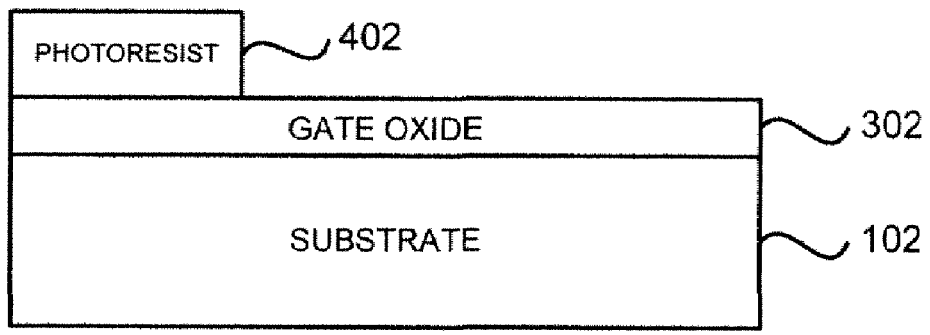

FIG. 4 is a side view showing photoresist 402 disposed on a portion of the gate oxide material 302 according to an embodiment of the present invention. Photoresist 402 may be any suitable photosensitive material used in photolithography to transfer a pattern from a mask onto the gate oxide material 302. Photoresist 402 may be a liquid deposited on the surface of the gate oxide material 302 as a thin film then solidified by low temperature anneal. Photoresist 402 may be exposed using ultraviolet (UV) radiation. Photoresist 402 may be positive or negative.

Figure 5:
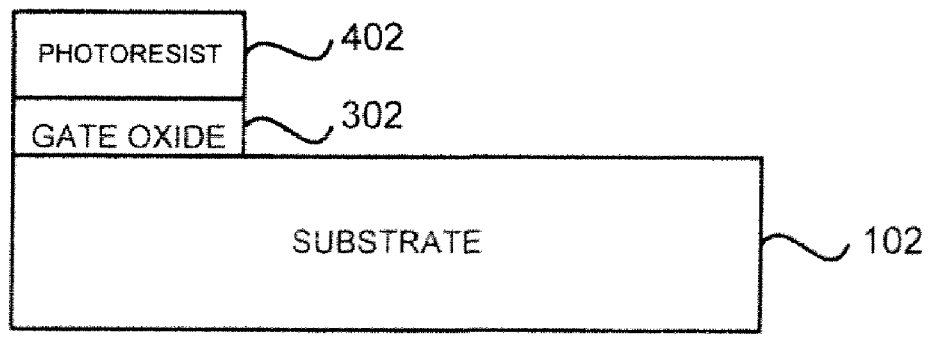

FIG. 5 is a side view showing the portion of the gate oxide material 302 masked by photoresist 402 remaining according to an embodiment of the present invention. The portion of the gate oxide material 302 not masked by photoresist 402 is removed. The portion of the gate oxide material 302 not masked by photoresist 402 may be removed using any suitable technique. One technique for removing photoresist and/or gate oxide is wet etching. The photoresist 402 may be removed using photographic developer. The gate oxide 302 may be removed using a suitable chemical wet etchant such as hydrofluoric acid. After removal of the photoresist 402 and the gate oxide material 302 not masked by the photoresist 402, the result may be a portion of the substrate 102 that includes no gate oxide 302 disposed thereon and a portion of the substrate 102 that includes the gate oxide material 302 disposed thereon.

Figure 6:
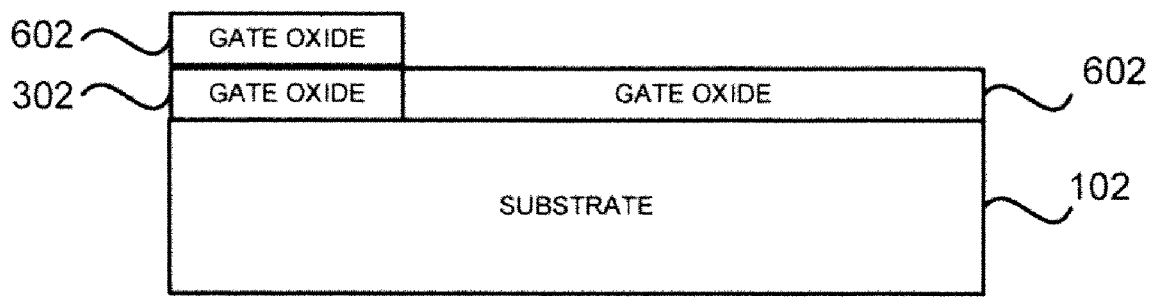

FIG. 6 is a side view showing a gate oxide material 602 disposed thereon according to an embodiment of the present invention. In the illustrated embodiment, the gate oxide material 602 is disposed on the gate oxide material 302 as well as the remaining portion of the substrate 102 previously having no gate oxide disposed thereon. The result is the substrate 102 having one thickness of gate oxide comprising the combination of the gate oxide material 302 and 602, and a second thickness of gate oxide that is just the gate oxide material 602.

Figure 7:
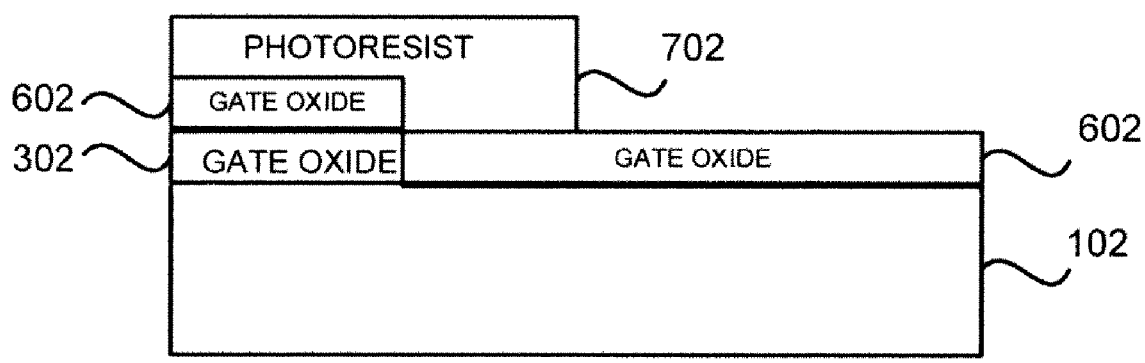

FIG. 7 is a side view showing photoresist 702 disposed on the combination of the gate oxide material 302 and 602 and on a portion of the gate oxide material 602 that is disposed by itself on the substrate 102 according to an embodiment of the present invention. A second portion of the gate oxide material 602 that is disposed by itself on the substrate 102 is not masked by the photoresist 702.

Figure 8:
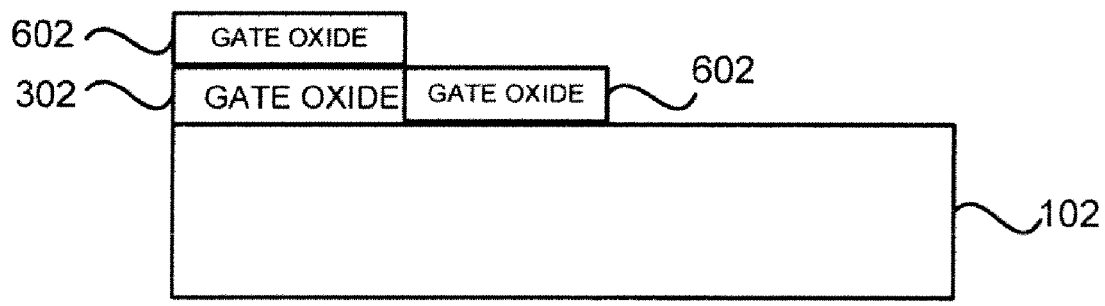

FIG. 8 is a side view showing the gate oxide after the photoresist 702 has been removed from the combination of the gate oxide material 302 and 602 and the portion of the gate oxide material 602 that is disposed by itself on the substrate 102 according to an embodiment of the present invention. In the illustrated embodiment, the combination of the gate oxide material 302 and 602 that was masked by the photoresist 702 remains. The portion of the gate oxide material 602 disposed by itself on the substrate 102 also remains. The portion of the gate oxide material 602 disposed on the substrate 102 that was not masked by the photoresist 702 has been removed. The result is the substrate 102 having one thickness of gate oxide comprising the combination of the gate oxide material 302 and 602 and a second thickness of gate oxide that is just the gate oxide material 602. Another portion of the substrate 102 has no gate oxide disposed thereon.

Figure 9:
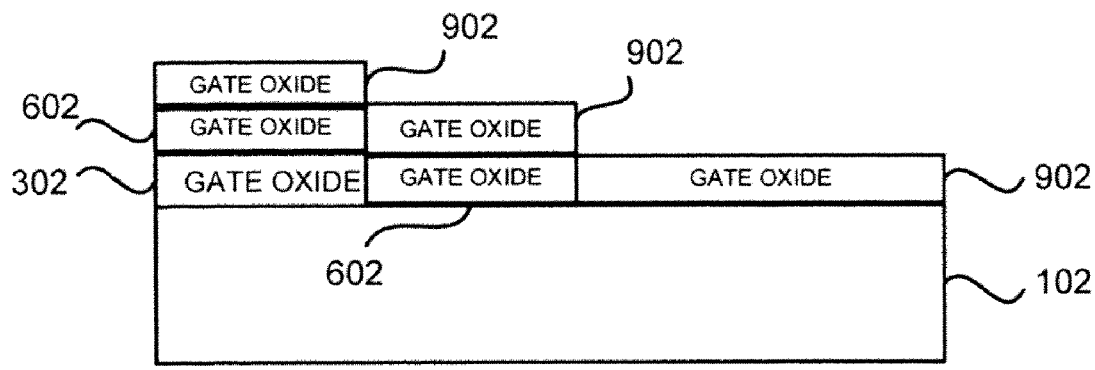

FIG. 9 is a side view showing a gate oxide material 902 disposed on the gate oxide comprising the combination of the gate oxide material 302 and 602, gate oxide material 602 disposed by itself on the substrate 102, and on the substrate 102 according to an embodiment of the present invention.

Figure 10:
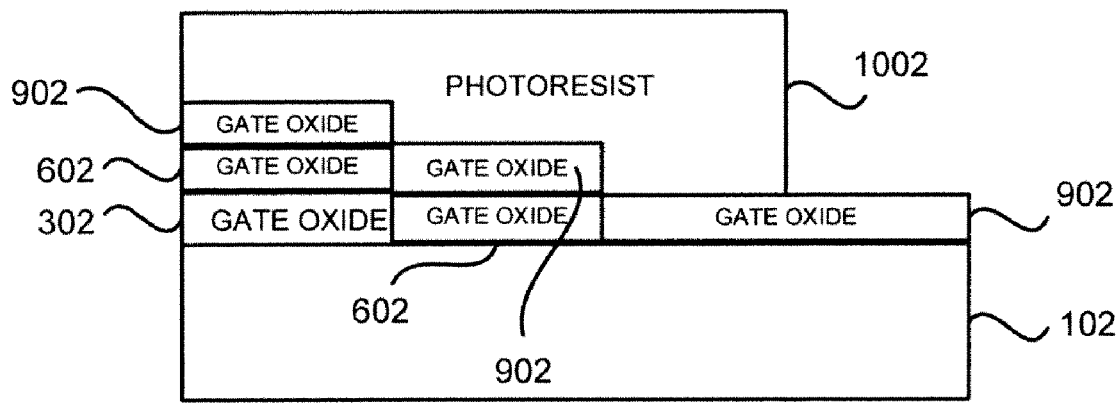

FIG. 10 is a side view showing photoresist 1002 disposed on the gate oxide comprising the combination of the gate oxide material 302, 602, and 902, on the gate oxide comprising the combination of the gate oxide material 302 and 602, gate oxide material 902 disposed by itself on the substrate 102, and on the substrate 102 according to an embodiment of the present invention. A portion that includes just the gate oxide material 902 disposed on the substrate 102 is not masked by the photoresist 1002.

Figure 11:
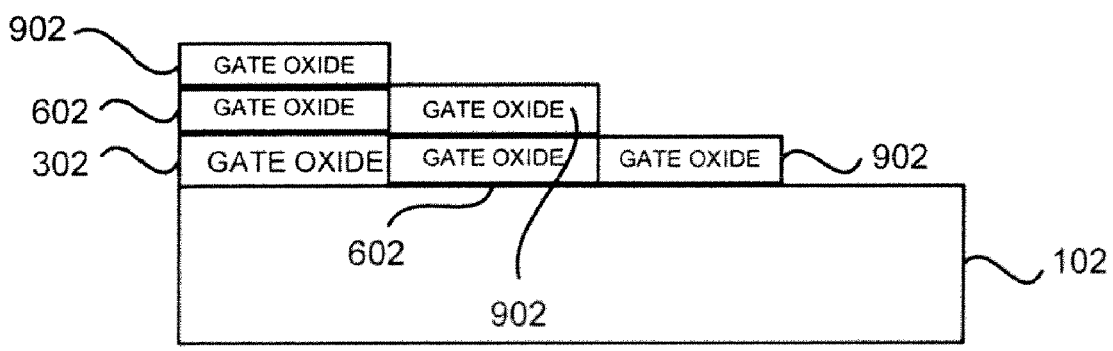

FIG. 11 is a side view showing the gate oxide after the photoresist 1002 has been removed according to an embodiment of the present invention. In the illustrated embodiment, the combination of the gate oxide material 302, 602, and 902 disposed on the substrate 102 that was masked by the photoresist 1002 remains. The portion that includes just the gate oxide material 602 and 902 disposed on the substrate 102 that was masked by the photoresist 1002 also remains. The portion that includes just the gate oxide material 902 disposed on the substrate 102 that was masked by the photoresist 1002 remains. The portion that included just the gate oxide material 902 disposed on the substrate 102 that was not masked by the photoresist 1002 has been removed.

The result is the substrate 102 having one thickness of gate oxide comprising the combination of the gate oxide material 302, 602, and 902, a second thickness of gate oxide that is the combination of gate oxide material 602 and 902, and a third thickness of gate oxide that is the gate oxide material 902. There remains a portion of the substrate 102 that has no gate oxide disposed thereon.

Figure 12:
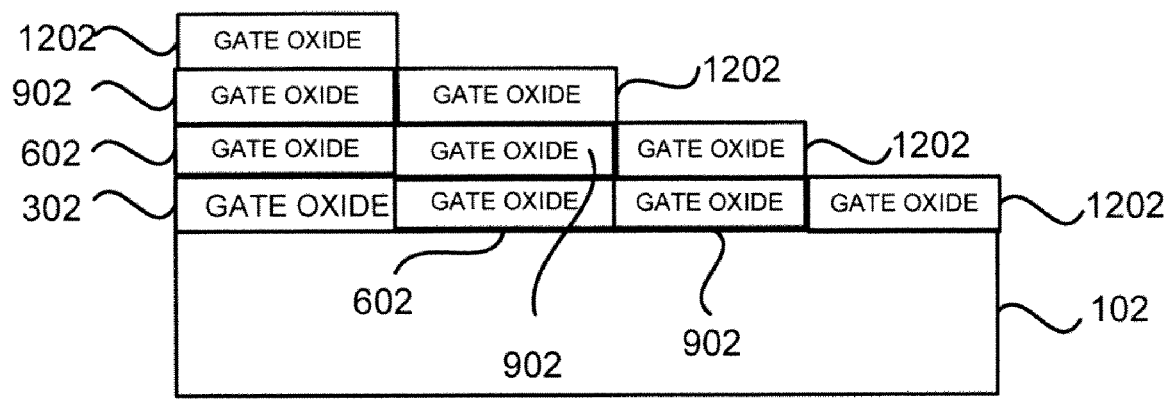

FIG. 12 is a side view showing gate oxide material 1202 disposed on the gate oxide that is the combination of the gate oxide gate oxide material 302, 602, and 902, on the gate oxide that is the combination of the gate oxide gate oxide material 602 and 902, on the gate oxide that is the gate oxide material 902 disposed on the substrate 102, and on the substrate 102 according to an embodiment of the present invention. The result is the substrate 102 having one thickness of gate oxide comprising the combination of the gate oxide material 302, 602, 902, and 1202, a second thickness of gate oxide that is the combination of gate oxide material 602, 902, and 1202, a third thickness of gate oxide that is the gate oxide material 902 and 1202, and a fourth thickness that is the gate oxide material 1202.

Figure 13:
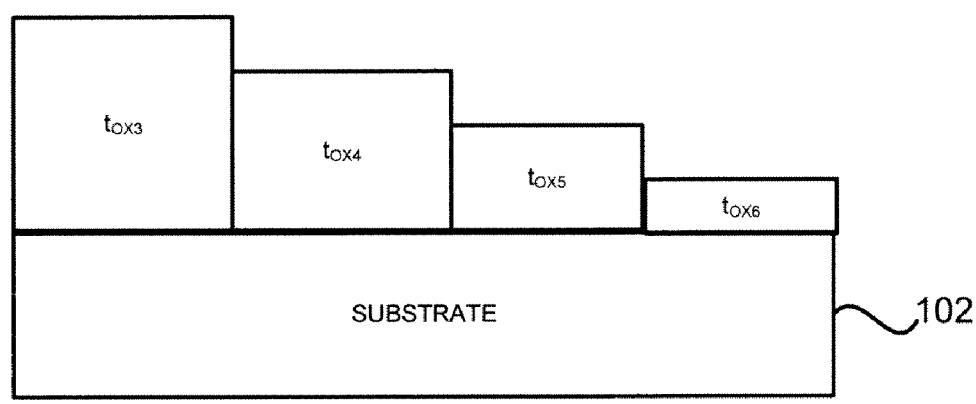
FIG. 13 is a side view of the portion of the light sensor cell in FIG. 2 having four gate oxide thicknesses according to an embodiment of the present invention.

FIG. 13 is a side view of the light sensor cell 200 having four gate oxide thicknesses according to an embodiment of the present invention. In the illustrated embodiment, the light sensor cell 200 includes the first gate oxide thickness $t_{ox3}$ near the photosensitive element 104 stepped in an increment to the second thickness $t_{ox4}$. The second thickness $t_{ox4}$ is stepped to the third thickness $t_{ox5}$. The third thickness $t_{ox5}$ is stepped to the fourth thickness $t_{ox6}$. The first thickness $t_{ox3}$ may include the combination of the gate oxide gate oxide material 302, 602, 902, and 1202. The second thickness $t_{ox4}$ may include the combination of the gate oxide gate oxide material 602, 902, and 1202. The third thickness $t_{ox5}$ may include the combination of the gate oxide gate oxide material 902 and 1202. The fourth thickness $t_{ox6}$ may include the gate oxide material 1202.

In an alternative embodiment, a stepped oxide profile may be implemented by growing the thickest oxide layer first. A portion or portions of the thickest oxide layer may then be etched off with photoresist using a mask for each new portion to be etched.

It will be appreciated by those skilled in the relevant art having benefit of this disclosure that the thickness of the gate oxide 108 near the photosensitive element 104 must not be so large as to prevent the inversion of the transfer gate 110 channel during readout, for operating transfer gate high voltages. Also, the thickness of the gate oxide 108 near the floating diffusion region 106 must not be too small so as to cause the transfer gate 110 to break down, such as due to hot carrier induced high gate currents or time dependent dielectric breakdown (TDDB) due to high gate electric fields. For light sensor cells fabricated using complementary metal oxide semiconductor (CMOS) technologies of 0.18 micrometers and beyond, the gate oxide thickness may be around 85 angstroms near the photosensitive element 104 and approximately 45 angstroms near the floating diffusion region 106.

Figure 14:
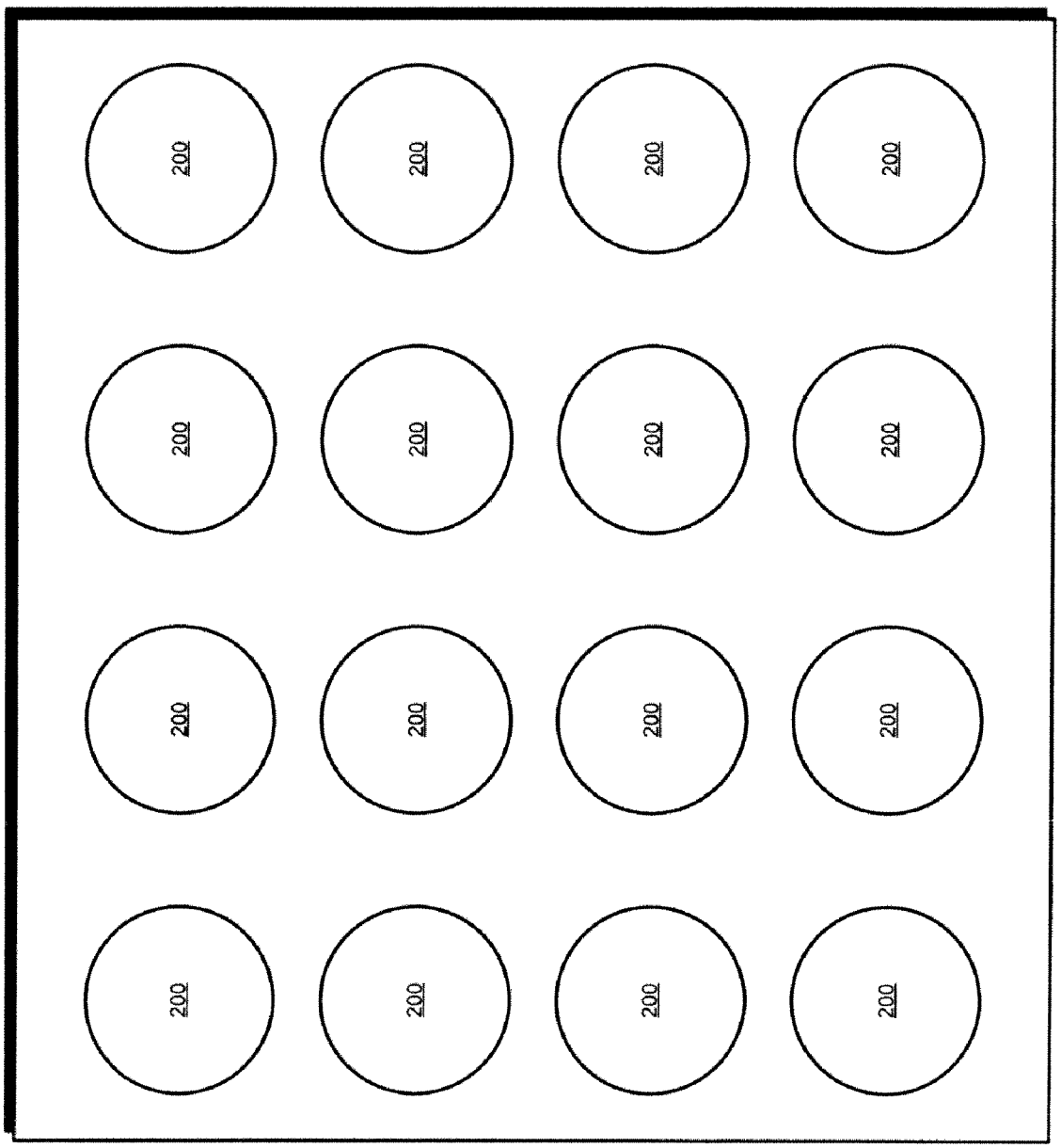
FIG. 14 is a top view of an image sensor array according to an embodiment of the present invention.

FIG. 14 is a top view of an image sensor array 1400 according to an embodiment of the present invention. In the illustrated embodiment, array 1400 includes several light sensor cells 200 arranged in an array of two dimensional rows and columns. At least one of the light sensor cells 200 includes the non-uniform gate oxide thickness described herein according to embodiments of the present invention. For some embodiments, either all or some of the sensor cells have non-uniform gate oxide thickness.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising: a light sensor cell disposed in a substrate, the light sensor cell having: a photosensitive element; a floating diffusion region; a gate oxide disposed between the photosensitive element and the floating diffusion region, the gate oxide having at least a first and a second thicknesses; wherein the first thickness of the gate oxide is in proximity to the photosensitive element and the second thickness of the gate oxide is in proximity to the floating diffusion region; and the first thickness of the gate oxide is greater than the second thickness of the gate oxide; and a transfer gate disposed on the gate oxide between the photosensitive element and the floating diffusion region, wherein the first thickness of the gate oxide extends from the substrate to the transfer gate and wherein the second thickness of the gate oxide extends from the substrate to the transfer gate, and wherein the first thickness and the second thickness generate a driving force to accelerate the flow of electrons from the photosensitive element toward the floating diffusion region.

2. The apparatus of claim 1, wherein a first thickness is graded to a second thickness.

3. The apparatus of claim 2, wherein the first thickness is stepped to the second thickness.

4. The apparatus of claim 1, wherein the gate oxide comprises silicon dioxide.

5. The apparatus of claim 1, wherein the substrate comprises silicon.

6. The apparatus of claim 1, wherein the photosensitive element is a PN junction photosensitive element.

7. The apparatus of claim 1, further comprising shallow trench isolation disposed in the substrate.

8. The apparatus of claim 1 further comprising:
a first effective threshold characterized by the first thickness;
a second effective threshold characterized by the second thickness; wherein
the first effective threshold voltage is greater than the second effective threshold voltage.

9. A method, comprising:
accumulating an electrical signal in a photosensitive element disposed in a substrate in response to incident light;
applying a bias voltage to a transfer gate disposed on a gate oxide, the gate oxide being disposed on the substrate;
generating a first potential in proximity to the photosensitive element, the first potential being associated with a first effective threshold voltage for the transfer gate;
generating a second potential in proximity to a floating diffusion region disposed in the substrate, the second potential being associated with a second effective threshold voltage for the transfer gate; and
generating a flow of electrons from the electrical signal, the electrons to flow from the photosensitive element to the floating diffusion region; wherein
the first effective threshold voltage is greater than the second effective threshold voltage and wherein generating the first potential and the second potential includes generating a driving force to accelerate the flow of electrons from the photosensitive element toward the floating diffusion region.

10. The method of claim 9, wherein the bias voltage is a positive voltage.

11. The method of claim 9, further comprising:
applying a second bias voltage to the transfer gate; and
substantially preventing the flow of electrons from the photosensitive element to the floating diffusion region.

12. The method of claim 11, wherein the second bias voltage is either a negative voltage or zero voltage.

13. A method, comprising:
accumulating an electrical signal in a photosensitive element disposed in a substrate in response to incident light;
applying a bias voltage to a transfer gate disposed on a gate oxide, the gate oxide being disposed on the substrate;
generating a first potential in proximity to the photosensitive element, the first potential being associated with a first thickness for the gate oxide;
generating a second potential in proximity to a floating diffusion region disposed in the substrate, the second potential being associated with a second thickness for the gate oxide; and
generating a flow of electrons from the electrical signal, the electrons to flow from the photosensitive element to the floating diffusion region; wherein
the first thickness is greater than the second thickness and wherein generating the first potential and the second potential includes generating a driving force to accelerate the flow of electrons from the photosensitive element toward the floating diffusion region.

14. The method of claim 13, wherein the bias voltage is a positive voltage.

15. The method of claim 13, further comprising:
applying a second bias voltage to the transfer gate; and
substantially preventing the flow of electrons from the photosensitive element to the floating diffusion region.

16. The method of claim 15, wherein the second bias voltage is a negative voltage.

* * * * *